US012776477B2

(12) United States Patent
Kim et al.

(10) Patent No.: US 12,776,477 B2
(45) Date of Patent: Oct. 27, 2026

(54) PLASMA CONTROL APPARATUS AND METHOD USING THE SAME

(71) Applicant: Samsung Electronics Co., Ltd., Suwon-si (KR)

(72) Inventors: Changho Kim, Suwon-si (KR); Donghyeon Na, Suwon-si (KR); Yoonbum Nam, Suwon-si (KR); Seungbo Shim, Suwon-si (KR); Kyungsun Kim, Suwon-si (KR); Namkyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 630 days.

(21) Appl. No.: 18/199,982

(22) Filed: May 22, 2023

(65) Prior Publication Data

US 2024/0128054 A1 Apr. 18, 2024

(30) Foreign Application Priority Data

Oct. 14, 2022 (KR) ........................ 10-2022-0132720

(51) Int. Cl.
*H01J 37/32* (2006.01)
*H10P 74/00* (2026.01)

(52) U.S. Cl.
CPC .. *H01J 37/32165* (2013.01); *H01J 37/32183* (2013.01); *H01J 37/32642* (2013.01);
(Continued)

(58) Field of Classification Search
CPC ........... H01J 37/32165; H01J 37/32183; H01J 37/32642; H01J 37/32715;
(Continued)

(56) References Cited

U.S. PATENT DOCUMENTS 9,761,414 B2 9/2017 Marakhtanov et al.
9,934,947 B2 4/2018 Kubota
(Continued)

FOREIGN PATENT DOCUMENTS

KR 100485595 B1 4/2005
KR 1020100035169 A 4/2010
(Continued)

OTHER PUBLICATIONS

C. Lascu, L. Asiminoaei, I. Boldea and F. Blaabjerg, "High Performance Current Controller for Selective Harmonic Compensation in Active Power Filters," IEEE Transactions on Power Electronics, vol. 22, No. 5, pp. 1826-1835, Sep. 2007.
(Continued)

*Primary Examiner* — Yuechuan Yu
(74) *Attorney, Agent, or Firm* — Muir Patent Law, PLLC

(57) ABSTRACT

A plasma control apparatus includes a first transmission line and a second transmission line transferring radio frequency (RF) power to a plasma chamber, a matcher disposed on the first transmission line a first plasma control circuit disposed on the first transmission line and configured to selectively and independently control harmonics of one or more of the at least two frequencies, a sensor configured to sense the harmonics of the plasma chamber, and an auxiliary RF power source disposed on the second transmission line and configured to generate auxiliary RF power to cancel out the harmonics sensed by the sensor, wherein, in a plan view, the first transmission line transfers the RF power adjacent to the center of the plasma chamber, and the second transmission line transfers the RF power and the auxiliary RF power and the auxiliary RF power adjacent to an edge of the plasma chamber.

15 Claims, 9 Drawing Sheets

(52) U.S. Cl.
CPC ...... *H01J 37/32715* (2013.01); *H10P 74/238* (2026.01); *H01J 37/32568* (2013.01); *H01J 37/32917* (2013.01); *H01J 2237/2007* (2013.01); *H01J 2237/24564* (2013.01); *H01J 2237/334* (2013.01)

(58) Field of Classification Search
CPC ........... H01J 37/32568; H01J 37/32917; H01J 2237/2007; H01J 2237/24564; H01J 2237/334; H01P 74/238
See application file for complete search history.

(56) References Cited

U.S. PATENT DOCUMENTS

| | | | | |
|---|---|---|---|---|
| 10,638,593 | B2 | 4/2020 | Long et al. | |
| 10,916,409 | B2 | 2/2021 | Marakhtanov et al. | |
| 11,037,761 | B2 | 6/2021 | Haga | |
| 11,257,660 | B2 | 2/2022 | Kim et al. | |
| 11,282,678 | B2 | 3/2022 | Na et al. | |
| 2010/0243606 | A1 * | 9/2010 | Koshimizu | H01J 37/32091 156/345.44 |
| 2017/0365445 | A1 * | 12/2017 | Kubota | H01J 37/3299 |
| 2020/0373126 | A1 * | 11/2020 | Na | H01J 37/32183 |
| 2021/0020412 | A1 * | 1/2021 | Kim | H01J 37/32183 |
| 2022/0139673 | A1 | 5/2022 | Kim et al. | |

FOREIGN PATENT DOCUMENTS

| | | | |
|---|---|---|---|
| KR | 1020180036786 | A | 4/2018 |
| KR | 102175086 | B1 | 11/2020 |
| KR | 1020200135114 | A | 12/2020 |
| KR | 102219568 | B1 | 2/2021 |
| KR | 1020220125292 | A | 9/2022 |

OTHER PUBLICATIONS

S. B. Efe, M. Cebeci, H. Erdoan and G. Özturkmen, "A novel approach to power flow analysis for grid connected micro grid," 2015 13th International Conference on Engineering of Modern Electric Systems (EMES), Oradea, Romania, 2015, pp. 1-4.

Yang, Yang & Kushner, Mark, "Modeling of dual frequency capacitively coupled plasma sources utilizing a full-wave Maxwell solver: I. Scaling with high frequency." Plasma Sources Sci. Technol. (2010). 859. 141-213.

* cited by examiner

PLASMA CONTROL APPARATUS AND METHOD USING THE SAME

CROSS-REFERENCE TO RELATED APPLICATION

This application is based on and claims priority under 35 U.S.C. § 119 to Korean Patent Application No. 10-2022-0132720, filed on Oct. 14, 2022, in the Korean Intellectual Property Office, the disclosure of which is incorporated by reference herein in its entirety.

BACKGROUND

The present disclosure relates to a plasma control apparatus and a substrate treating method using the same, and more particularly, to a plasma control apparatus for controlling plasma distribution inside a plasma chamber and a substrate treating method using the same.

In general, in order to manufacture semiconductor devices, a series of processes, such as deposition, etching, and cleaning, may be performed. These processes may be performed through a deposition, etching, or cleaning apparatus having a process chamber. Meanwhile, in order to improve selectivity and reduce thin film damage, plasma technologies, such as capacitive coupled plasma (CCP), inductive coupled plasma (ICP), or a combination of CCP and ICP have been adopted. Plasma technology includes direct plasma technology that directly generates plasma in a process chamber, which is a wafer treatment space, and remote plasma technology that generates plasma outside a process chamber and supplies the generated plasma to the process chamber.

SUMMARY

Aspects of the inventive concept provide a plasma control apparatus for controlling plasma to be uniformly distributed in a plasma chamber, and a substrate treating method using the same.

According to an aspect of the inventive concept, a plasma control apparatus includes a first transmission line and a second transmission line, each connected to transfer radio frequency (RF) power to a plasma chamber through at least two frequencies, wherein RF power transferred by the first transmission line is main RF power and RF power transferred by the second transmission line is auxiliary RF power, a matching circuit connected to the first transmission line and configured to adjust impedance to increase power transmission of the main RF power, a first plasma control circuit connected to the first transmission line and configured to selectively and independently control harmonics of one or more of the at least two frequencies of the main RF power, a sensor configured to sense harmonics of the main RF power in the plasma chamber, and an auxiliary RF power source connected to the second transmission line and configured to generate auxiliary RF power to cancel out the harmonics sensed by the sensor, wherein, in a plan view, the first transmission line transfers the main RF power to a central region of the plasma chamber, and the second transmission line transfers the auxiliary RF power to an edge region outside the central region of the plasma chamber.

According to an aspect of the inventive concept, a plasma control apparatus includes a plasma chamber including an electrode portion and an edge ring surrounding the electrode portion and having a ring shape, a first transmission line and a second transmission line, each transferring RF power to the plasma chamber through at least two frequencies, wherein RF power transferred by the first transmission line is main RF power, and RF power transferred by the second transmission line is auxiliary RF power, a matching circuit connected to the first transmission line and configured to adjust impedance to increase power transmission of the main RF power, a first plasma control circuit connected to the first transmission line and configured to selectively and independently control one or more harmonics of the at least two frequencies of the main RF power, a sensor configured to sense the harmonics of the main RF power in the plasma chamber, an auxiliary RF power source connected to the second transmission line and configured to generate auxiliary RF power to cancel out the harmonics sensed by the sensor, and a second plasma control circuit connected to the second transmission line and configured to control the auxiliary RF power source, wherein, in a plan view, the first transmission line is connected to transfer the main RF power to a center region of the plasma chamber, and the second transmission line is adjacent to an edge of the plasma chamber to transfer the auxiliary RF power to an edge region of the plasma chamber.

According to an aspect of the inventive concept, A method of manufacturing a semiconductor chip includes placing a wafer in a plasma chamber; applying main radio frequency (RF) power to the plasma chamber to perform a plasma process on the wafer; sensing whether harmonics are generated in the plasma chamber; generating auxiliary radio frequency (RF) power that cancels out the harmonics when it is sensed that the harmonics are generated; and transferring the generated auxiliary RF power to the plasma chamber, so that the auxiliary RF power is also applied to the plasma chamber to perform the plasma process on the wafer. The plasma chamber includes an electrode portion and an edge ring surrounding the electrode portion and having a ring shape. The main RF power includes at least two frequencies and is transferred to the plasma chamber through a first transmission line. A matching circuit is connected to the first transmission line and adjusts impedance to increase power transmission of the main RF power. A sensor senses harmonics of the main RF power in the plasma chamber, and an auxiliary RF power is generated by an auxiliary RF power source connected to a second transmission line. In a plan view, the first transmission line transfers the main RF power to a center region of the plasma chamber, and the second transmission line transfers the auxiliary RF power to an edge region of the plasma chamber outside the center region.

According to an aspect of the inventive concept, a method of manufacturing a semiconductor device includes placing a wafer on a chuck in a plasma chamber; applying a main RF power from a first power source to the plasma chamber through a first transmission line connected to the plasma chamber, using a matching circuit for impedance matching; applying an auxiliary RF power from a second power source to the plasma chamber through a second transmission line in a matchless manner; and performing a plasma process on the wafer while applying the main RF power and auxiliary RF power to the plasma chamber.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
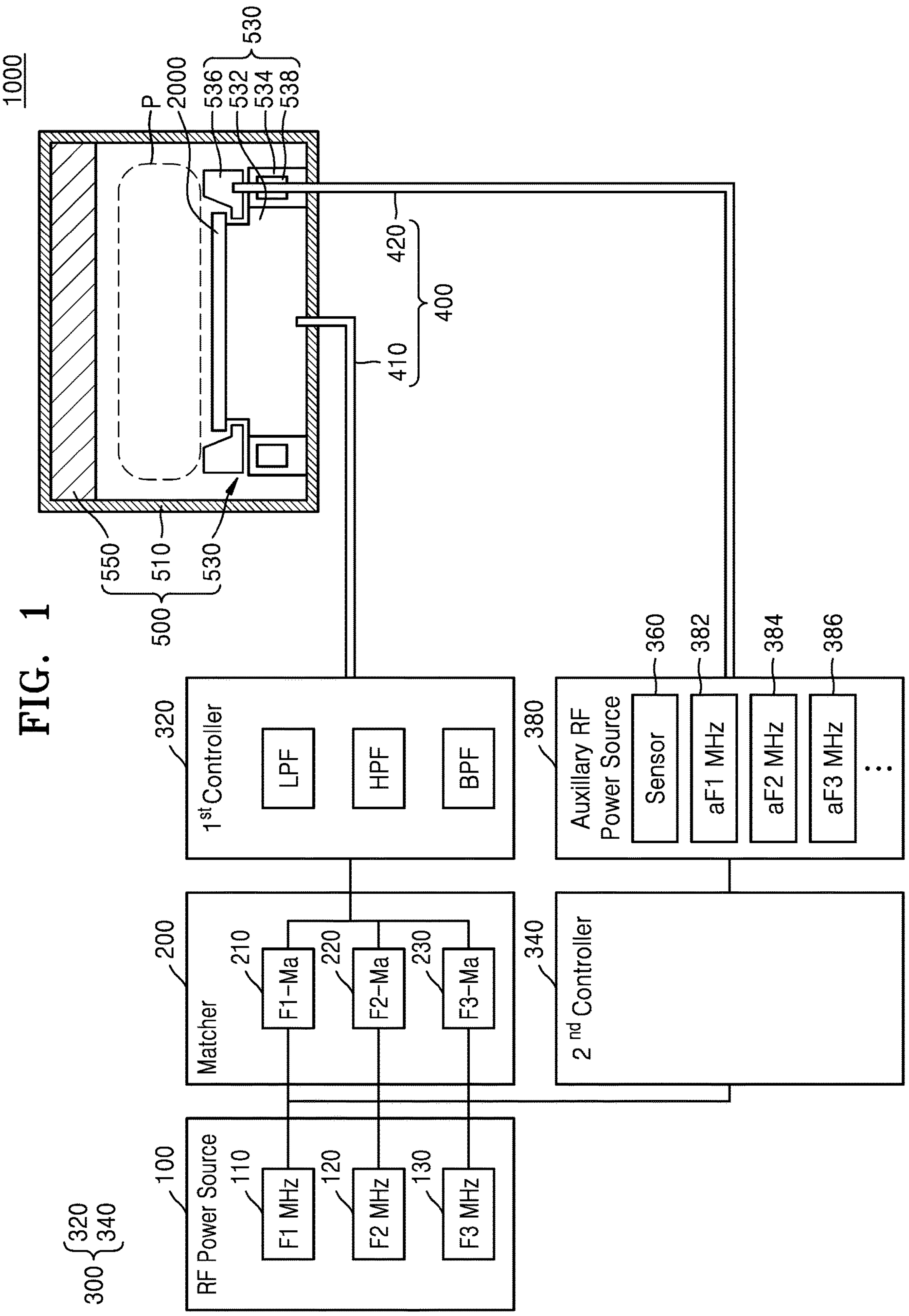
FIG. 1 is a configuration diagram of a plasma processing system according to an embodiment.

Hereinafter, embodiments are described in detail with reference to the accompanying drawings. The same reference numerals are used for the same components in the drawings, and redundant descriptions thereof are omitted.

FIG. 1 is a configuration diagram of a plasma processing system 1000 according to an embodiment.

Referring to FIG. 1, the plasma processing system 1000 of the present embodiment includes a radio frequency (RF) power source 100, a matcher 200, a plasma control circuit 300, a sensor 360, an auxiliary RF power source 380, a transmission line 400, and a plasma chamber 500.

The plasma processing system 1000 may be configured to generate plasma. The plasma processing system 1000 may include a capacitively coupled plasma (CCP) source, an inductively coupled plasma (ICP) source, a microwave plasma source, a remote plasma source, and the like.

The plasma processing system 1000 may be a device for processing a wafer 2000 using the generated plasma. The plasma processing system 1000 may perform one of plasma annealing, plasma etching, plasma enhanced chemical vapor deposition (PECVD), sputtering, and plasma cleaning on the wafer 2000.

The RF power source 100 may generate and supply RF power to the plasma chamber 500. The RF power source 100 may generate and output RF power of various frequencies. For example, the RF power source 100 may include three power-generating sources, e.g., a first source 110 (or F1 MHz), a second source 120 (or F2 MHz), and a third source 130 (or F3 kHz). Here, the first source 110 may generate RF power having a first frequency (F1 MHz) in a range of several MHz to several tens of MHz. The second source 120 may generate RF power having a second frequency (F2 MHz) in a range of hundreds of kHz to several MHz. The third source 130 may generate RF power having a third frequency (F3 kHz) in a range of tens of kHz to hundreds of kHz. In addition, each of the three first to third sources 110, 120, and 130 of the RF power source 100 may generate and output power of hundreds to tens of thousands of watts (W). The RF powers generated by the RF power source 100 may be described herein as main RF power, which is in contrast with the auxiliary RF power described in more detail below. For example, the main RF power may cause generation of plasma used to perform a plasma process on a wafer, and the auxiliary RF power may causes cancellation of harmonics in the chamber caused by the main RF power.

In the plasma processing system 1000 of the present embodiment, the RF power source 100 includes three first to third sources 110, 120, and 130, but the sources included in the RF power source 100 are not limited thereto. For example, the RF power source 100 may include two or less sources, or four or more sources. In addition, a frequency range and power of the RF power generated by the sources are not limited to the above frequency range and power. For example, according to embodiments, at least one source included in the RF power source 100 may generate RF power having a frequency of several tens of kHz or less or several hundred MHz or higher. In addition, at least one source included in the RF power source 100 may generate RF power having a power of several hundred Watts or less or thousands of Watts or more.

For reference, in the plasma processing system 1000 of the present embodiment, the RF power source 100 may correspond to power supplying power to the plasma chamber 500. In addition, the plasma chamber 500 may be regarded as a kind of load receiving power from the RF power source 100.

In the plasma processing system 1000 of the present embodiment, the RF power source 100 may include at least two sources to generate RF power of various frequencies and supply the generated RF power to the plasma chamber 500. Through this, ion energy and plasma density of the plasma chamber 500 may be independently controlled. For example, in more detail with the RF power source 100 including three first to third sources 110, 120 and 130, the high frequency RF power from the first source 110 may generate plasma, and the low frequency RF power from the third source 130 may supply energy to ions. Meanwhile, a function of the middle frequency RF power from the second source 120 may vary depending on the desired effect. For example, the RF power of the second source 120 may improve the function of the RF power from the first source 110 and/or the RF power from the third source 130. Meanwhile, RF power may be applied in a pulse form, so that RF power is repeatedly turned on and off in a periodic manner to improve an etch rate and an etch profile based on plasma in the plasma chamber 500.

The matcher 200 may adjust impedance so that RF power from the RF power source 100 may be transferred to the plasma chamber 500 as much as possible. The matcher 200 may be disposed on the first transmission line 410. For example, the matcher 200 may increase RF power delivery (or increase power transmission by the first transmission line 410) by adjusting impedance so that a complex conjugate condition is satisfied based on maximum power delivery theory. For example, in one embodiment, the matcher 200 allows the RF power source 100 to drive in an environment of 50Ω to reduce reflected power, so that the RF power from the RF power source 100 is transferred to the plasma chamber 500 as much as possible.

The matcher 200, also described as a matching circuit, may include three sub-matchers corresponding to respective frequencies of RF power. For example, the matcher 200 may include a first sub-matcher (F1-Ma) 210 corresponding to the first frequency F1 MHz of the first source 110, a second sub-matcher (F2-Ma) 220 corresponding to the second frequency F2 MHz of the second source 120, and a third sub-matcher (F3-Ma) 230 corresponding to the third frequency F3 kHz of the third source 130. Each of the three sub-matchers 210, 220, and 230 (or the first, second, and third sub-matchers 210, 220, and 230) may adjust impedance so that RF power of the corresponding frequency is transferred as much as possible. Each of the three sub-matchers (210, 220, 230) may include circuit elements such as capacitors, and/or inductors, to perform the impedance adjusting.

The plasma control circuit 300 may control and adjust a distribution of plasma in the plasma chamber 500 by selectively and/or independently controlling harmonics of a very high frequency (VHF) among the frequencies of the RF power. The VHF may have a frequency ranging from about 30 MHz to about 300 MHz. For example, the plasma control circuit 300 may control and adjust the distribution of plasma in the plasma chamber 500 by selectively and/or independently controlling harmonics of the first frequency (F1 MHz) of the first source 110 corresponding to the VHF. Here, the distribution of plasma may refer to a density distribution of plasma. In the present disclosure, VHF may also be referred to as high frequency.

The plasma control circuit 300 may include a first plasma control circuit (or a first controller) 320 and a second plasma control circuit (or a second controller) 340. The first plasma control circuit 320 may be connected to an electrostatic chuck 530 through the first transmission line 410. For example, the first plasma control circuit 320 may be electrically connected to an electrode portion 532 of the electrostatic chuck 530.

The first plasma control circuit 320 may perform a filtering function of allowing only a certain range of frequencies, among frequencies of the RF power output from the matcher 200 to pass therethrough. For example, the first plasma control circuit 320 may include a variable capacitor. The first plasma control circuit 320 may include, for example, a low pass filter (LPF), a high pass filter (HPF), and/or a band pass filter (BPF). The first plasma control circuit 320 may be referred to as a passive plasma control circuit.

The LPF, HPF, and/or BPF may be located at an output terminal of the matcher 200 to allow a fundamental wave of each frequency of RF power from the matcher 200 to pass therethrough and block other components. For example, the LPF, HPF and/or BPF may block harmonic components of each of the frequencies of the RF power. Here, the output terminal of the matcher 200 may refer to a portion through which RF power is output from the matcher 200 in a direction in which the RF power is transferred from the RF power source 100 to the plasma chamber 500, and conversely, an input terminal of the matcher 200 may refer to a portion through which RF power is input to the matcher 200.

According to embodiments, in the first plasma control circuit 320, at least one of the LPF, HPF, and BPF may be omitted. For example, each of the three sub-matchers (the first, second, and third sub-matchers 210, 220, and 230) of the matcher 200 may include an LPF. In such a case, the LPF may be omitted from the first plasma control circuit 320.

The second plasma control circuit 340 may control the auxiliary RF power source 380 to generate auxiliary RF power that cancels out harmonics of the plasma chamber 500. The second plasma control circuit 340 may communicate with the RF power source 100, the sensor 360 and/or the auxiliary RF power source 380. The second plasma control circuit 340 may control the sensor 360 and/or the auxiliary RF power source 380 to operate when the RF power source 100 generates a high frequency. The second plasma control circuit 340 may control the auxiliary RF power source 380 to cancel out harmonics sensed by the sensor 360. When harmonics transferred from the sensor 360 are sensed, the second plasma control circuit 340 may control the auxiliary RF power source 380 to generate auxiliary RF power corresponding thereto. When harmonics transferred from the sensor 360 are not sensed, the second plasma control circuit 340 may control the auxiliary RF power source 380 not to generate auxiliary RF power.

The second plasma control circuit 340 may contribute to adjusting the distribution of plasma inside the plasma chamber 500 by controlling a characteristic impedance of an edge region adjacent to an edge ring 536. The second plasma control circuit 340 may control a VHF harmonic component of the edge region of the plasma chamber 500.

The second plasma control circuit 340 may be implemented in hardware, firmware, software, or any combination thereof. For example, the second plasma control circuit 340 may be a computing device, such as a workstation computer, a desktop computer, a laptop computer, or a tablet computer. For example, the second plasma control circuit 340 may include a memory device, such as read only memory (ROM) and random access memory (RAM), and a processor configured to perform certain operations and algorithms, for example, a microprocessor, a central processing unit (CPU), a graphics processing unit (GPU), and the like. In addition, the second plasma control circuit 340 may include a receiver and a transmitter receiving and transferring electrical signals.

The sensor 360 may sense harmonics inside the plasma chamber 500 generated by the RF power source 100. The sensor 360 may sense harmonics generated due to nonlinearity of plasma inside the plasma chamber 500. For example, the sensor 360 may include a VI probe. Harmonic information sensed by the sensor 360 may be transferred to the second plasma control circuit 340. For example, the sensor 360 may be located to be in or adjacent to the edge region of the plasma chamber 500, and may be in an outer region of the plasma chamber that includes the edge ring 536. For example, sensor 360 may be located to sense plasma on the edge ring 536.

The auxiliary RF power source 380 may generate auxiliary RF power that cancels out harmonics inside the plasma chamber 500 under control by the second plasma control circuit 340. For example, the auxiliary RF power source 380 may generate auxiliary RF power which is equal in magnitude and frequency and opposite in phase to the harmonics intended to be removed. The auxiliary RF power source 380 may include, for example, one or more auxiliary sources, nonlinear generator circuits, phase shift circuits, scaling circuits, and/or amplifiers. The auxiliary RF power source 380 may be referred to as an active plasma control circuit. The first plasma control circuit 320 and the auxiliary RF power source 380 may be collectively referred to as a hybrid harmonic controller (HHC).

The auxiliary RF power source 380 may include a plurality of auxiliary power-generating sources. For example, the auxiliary RF power source 380 may include a first auxiliary source (or aF1 MHz) 382, a second auxiliary source (or aF2 MHz) 384, and a third auxiliary source (or aF3 MHz) 386. Each of the first to third auxiliary sources 382, 384, and 386 may have a frequency corresponding to several times the high frequency (e.g., an integer multiple of the high frequency, which may be the same frequency or an integer multiple of at least one of the harmonics of the high-frequency signal or one of the harmonics sensed by the sensor 360). According to embodiments, the frequency of the high-frequency signal may be from about 40 MHz to about 200 MHz or less, but is not limited thereto. According to embodiments, a period of the high-frequency signal may be greater than or equal to about 0.5 ns and less than or equal to about 2.5 ns, but is not limited thereto.

For example, although the auxiliary RF power source 380 is shown as including three auxiliary sources, the number of auxiliary sources included in the auxiliary RF power source 380 is not limited thereto. For example, the auxiliary RF power source 380 may include two or less auxiliary sources, or four or more auxiliary sources. For example, the number of auxiliary sources of the auxiliary RF power source 380 may be determined in proportion to the order of harmonics to be removed.

In FIG. 1 as an example, the auxiliary RF power source 380 is illustrated as including the sensor 360, but the inventive concept is not limited thereto. According to another embodiment, the sensor 360 may operate as a component separate from the auxiliary RF power source 380.

The auxiliary RF power source 380 may be coupled to the edge ring 536. The auxiliary RF power source 380 may be coupled to the edge ring 536 through a second transmission line 420. The auxiliary RF power applied from the auxiliary RF power source 380 may be applied to the plasma chamber 500 through the second transmission line 420. The auxiliary RF power applied from the auxiliary RF power source 380 may be applied adjacent to the edge region of the plasma chamber 500 through the second transmission line 420 (e.g., may be applied to an outer region of the plasma chamber that includes the edge ring 536). Therefore, if viewed from a plan view, the RF power from the RF power source 100 may be applied to a center, or central portion or region of the plasma chamber 500, and the auxiliary RF power from the auxiliary RF power source 380 may be applied to an outer portion, or edge region, of the plasma chamber 500, outside of and surrounding the central portion or region of the plasma chamber 500.

According to an embodiment, the sensor 360 and/or the auxiliary RF power source 380 may repeat an ON duty and an OFF duty. For example, when the high frequency of the RF power source 100 is applied to the plasma chamber 500, the sensor 360 and/or the auxiliary RF power source 380 may be selectively turned on and maintained in an ON duty state. For example, the second plasma control circuit 340 may control the sensor 360 and/or the auxiliary RF power source 380 to repeat ON duty and OFF duty states.

By further including the second plasma control circuit 340 connected to the edge ring 536 in the edge region, the plasma processing system 1000 of the present embodiment may address a plasma distribution problem that arises due to the edge ring 536 and a conductive ring 538 in the edge region, thereby more effectively controlling the distribution of plasma in the plasma chamber 500.

The transmission line 400 may be located between the RF power source 100 and the plasma chamber 500 to transfer RF power to the plasma chamber 500. The transmission line 400 may be implemented with, for example, a coaxial cable, an RF strap, or an RF rod. The coaxial cable may include a center conductor, an outer conductor, an insulator, and an outer sheath. The coaxial cable may have a structure in which the center conductor and the outer conductor are coaxially arranged. In general, coaxial cables may be suitable for broadband transmission because they have low attenuation up to high frequencies, and may also have low leakage due to the presence of the outer conductor. Accordingly, the coaxial cable may be mainly used as a transmission cable used when the frequency is high. For example, the coaxial cable may effectively transfer RF power having a frequency ranging from several MHz to several tens of MHz without leakage. Meanwhile, there are two types of coaxial cables with characteristic impedances of 50Ω and 75Ω.

The RF strap may include a strap conductor, a ground housing, and an insulator. The strap conductor may be shaped like a strip extending in one direction. The ground housing may have a shape of a circular tube surrounding the strap conductor at a certain distance. The ground housing may protect the strap conductor from RF radiation. Meanwhile, the insulator may fill a space between the strap conductor and the ground housing. The RF rod may be structurally different from the RF strap in that the RF rod includes a rod conductor, instead of a strap conductor. Specifically, the rod conductor of the RF rod may have a cylindrical shape extending in one direction. Such an RF strap or RF rod may transfer RF power having a frequency ranging from a few MHz to several tens of MHz, for example.

Impedance characteristics of the transmission line 400 may be changed by changing physical characteristics of the implemented coaxial cable, RF strap, and RF load. For example, when the transmission line 400 is implemented as a coaxial cable, the impedance characteristics of the transmission line 400 may be changed by changing a length of the coaxial cable. In addition, when the transmission line 400 is implemented as an RF strap or an RF rod, the impedance characteristics of the transmission line 400 may be changed by changing a length of the strap conductor or the rod conductor, changing a space size of the ground housing, or changing permittivity and/or permeability of the insulator.

The transmission line 400 may include the first transmission line 410 and the second transmission line 420. The first transmission line 410 may electrically connect the RF power source 100 to the electrode portion 532 (e.g. a chuck electrode), and the second transmission line 420 may electrically connect the auxiliary RF power source 380 to the edge ring 536.

The matcher 200 may be disposed on (e.g., may be connected to) the first transmission line 410, e.g., between the RF power source 100 and the transmission line 410, and in one embodiment, no matcher is disposed on (e.g., connected to) the second transmission line 420 (e.g., no matcher is between the RF power source 100 or auxiliary RF power source 380 and the second transmission line 420). For example, RF power applied to the electrode portion 532 may pass through the matcher 200, and RF power and auxiliary RF power applied to the edge ring 536 may not pass through the matcher 200 (or any matcher). Therefore, the auxiliary RF power may be applied to the edge ring 536 in a matchless manner.

The plasma chamber 500 may include a chamber body 510, the electrostatic chuck 530, and a shower head 550. The plasma chamber 500 is a chamber for a plasma process, and plasma P may be generated therein. The plasma chamber 500 may be a CCP (capacitively coupled plasma) chamber, an ICP (inductively coupled plasma) chamber, or a combination of the CCP and ICP chambers. Of course, the plasma chamber 500 is not limited to the chambers listed above. For reference, depending on the type of plasma chamber and the type of RF power applied to the plasma chamber, the plasma processing system 1000 may be classified as a CCP type, an ICP type, and a CCP and ICP-mixed type. The plasma processing system 1000 of the present embodiment may be the CCP type or the ICP type. In addition, the plasma processing system 1000 of the present embodiment may also be implemented as the CCP and ICP-mixed type.

The chamber body 510 may limit a reaction space in which plasma is formed to seal the reaction space from the outside. The chamber body 510 may generally include or be formed of a metal material, and may be maintained in a grounded state to block external noise during a plasma process. Although not shown, a gas inlet, a gas outlet, and a view-port may be formed in the chamber body 510. A process gas used for a plasma process may be supplied through the gas inlet. Here, the process gas may refer to all gases used in the plasma process, such as a source gas, a reaction gas, and a purge gas. After the plasma process, gases inside the plasma chamber 500 may be exhausted to the outside through the gas outlet. In addition, pressure inside the plasma chamber 500 may be adjusted through the gas outlet. Meanwhile, one or more view-ports may be formed in the chamber body 510, and the inside of the plasma chamber 500 may be monitored through the view-port.

The electrostatic chuck 530 may be disposed in a lower portion inside the plasma chamber 500. The wafer 2000, which is a target of a plasma process, may be disposed and fixed on an upper surface of the electrostatic chuck 530. The electrostatic chuck 530 may fix the wafer 2000 by force of static electricity. In addition, the electrostatic chuck 530 may include a bottom electrode for the plasma process. The electrostatic chuck 530 may be connected to the RF power source 100 through the transmission line 400. Accordingly, RF power from the RF power source 100 may be applied into the plasma chamber 500 through the electrostatic chuck 530.

The electrostatic chuck 530 may include the electrode portion 532, an isolating insulation 534, the edge ring 536, and the conductive ring 538. The electrode portion 532 is disposed in a central portion of a lower portion of the plasma chamber 500 and may include an electrode for power application for chucking/dechucking and a plasma process of the wafer 2000. The wafer 2000, which is a subject of the plasma process, may be disposed on an upper surface of the electrode portion 532 and fixed by electrostatic force.

The isolating insulation 534 has a structure surrounding the electrode portion 532, and the isolating insulation 534 may be formed of an insulator, such as alumina, for example. Of course, a material of the isolating insulation 534 is not limited thereto.

The edge ring 536 may be disposed outside the electrode portion 532 and surround the wafer 2000. The edge ring 536 may include or be formed of silicon and may induce an effect of expanding a silicon region of the wafer 2000 to prevent plasma from concentrating on an edge portion of the wafer 2000. The edge ring 536 may have a one ring type or a two ring type, and typically and as describe herein, the one ring type is referred to as a focus ring and the two ring type is referred to as a combo-ring.

The conductive ring 538 may be disposed inside the isolating insulation 534 and surrounds the electrode portion 532. The conductive ring 538 may include or be formed of a metal, such as aluminum. Of course, a material of the conductive ring 538 is not limited thereto. The conductive ring 538 may be electrically coupled to the edge ring 536 disposed thereabove and may contribute to adjustment of the distribution of plasma by the edge ring 536.

The shower head 550 may be disposed at an upper portion inside the plasma chamber 500. The shower head 550 may spray process gases supplied through the gas inlet into the plasma chamber 500 through a plurality of spray holes. Meanwhile, the shower head 550 may include or may form a top electrode. The shower head 550 may be connected to ground in a plasma process, for example.

In a general plasma processing system, an auxiliary RF power source for canceling harmonics inside a plasma chamber passes through a matcher, and thus, relatively high power is required to drive the auxiliary RF power source.

In addition, in the general plasma processing system, the sensor sensing harmonics inside the plasma chamber and the auxiliary RF power source are always operated, so that relatively high power is required.

However, in the plasma processing system 1000 of the present embodiment and in other embodiments as well, because the auxiliary RF power source 380 for canceling out harmonics inside the plasma chamber 500 is disposed on the second transmission line 420 and the auxiliary RF power 380 does not pass through the matcher 200, relatively low power is required to drive the auxiliary RF power source 380.

In addition, in the plasma processing system 1000 of the present embodiment and other embodiments, only when the high frequency of the RF power source 100 is applied, the sensor 360 and/or the auxiliary RF power source 380 selectively operate, so that a semiconductor process may be performed even with relatively low power.

Although etching has been mainly described above, the plasma processing system 1000 of the present embodiment may be equipment for a deposition process or a cleaning process. Accordingly, the plasma processing system 1000 according to the present embodiment may uniformly perform deposition or cleaning on the wafer 2000, which is a target of a plasma process, through uniformization of plasma distribution. Hereinafter, even if not specifically mentioned, the plasma processing system 1000 may be used not only for an etching process but also for a deposition process or a cleaning process.

Figure 2:
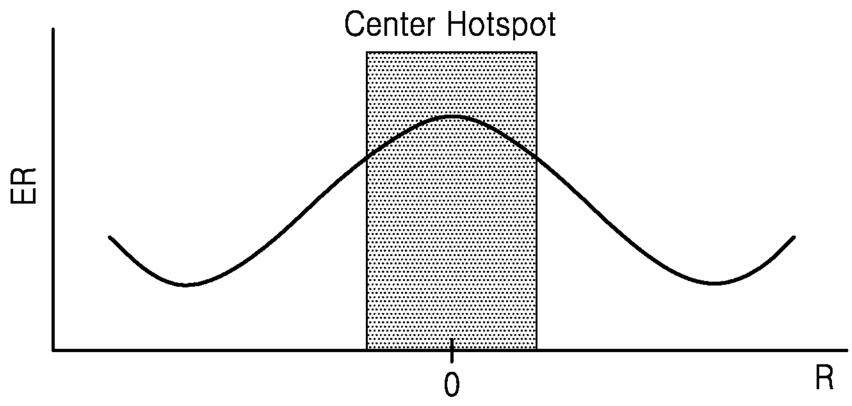
FIG. 2 is a graph illustrating an etch rate for a wafer in a plasma chamber.

FIG. 2 is a graph illustrating an etch rate of a wafer in a plasma chamber, in which the x-axis represents the radius R of the wafer 2000 and the y-axis represents an etch rate ER.

Referring to FIG. 2, in a general plasma process, the etch rate may be high in a central portion of the wafer and the etch rate may be low toward an outer portion of the wafer. In this manner, a phenomenon in which the etch rate increases in the central portion of the wafer is referred to as a center hotspot phenomenon, and the center hotspot is shaded on the graph.

The center hotspot phenomenon may become more serious as RF power increases. In addition, problems, such as punching, not open (NOP), crater, and clogging, may occur due to the center hotspot. Here, punching or NOP may be a problem in which a film is unintentionally pierced or a hole is not opened in etching by plasma, and a crater or clogging may be a problem in which a surface is raised or a hole entrance is closed due to process gas control to improve the center hotspot.

A cause of the center hotspot phenomenon is not clear. Harmonic components may increase the plasma density at the center of the wafer 2000. Accordingly, it may be predicted that the increased plasma density acts as a cause of increasing the etch rate at the center of the wafer 2000.

For reference, in the case of an existing plasma processing system, the center hotspot phenomenon may be addressed by adjusting the amount of process gas for each position in the plasma chamber or by changing a shape of the top electrode. However, the method of adjusting the amount of process gas may cause a control problem and the crater or clogging problems mentioned above. The method of changing the shape of the top electrode may be inconvenient to change every time according to all process conditions. In addition, a change over time due to etching may occur in the top electrode, but there is a problem in that compensation for the change over time is difficult or impossible to implement and prediction due to the change over time is also difficult or impossible.

Figure 3:
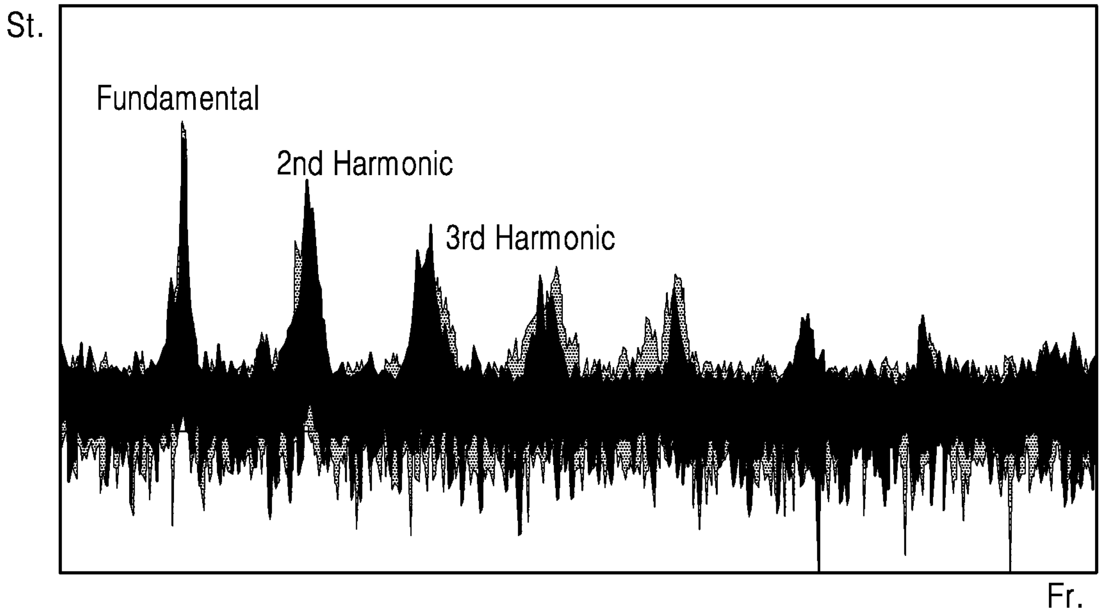
FIG. 3 is a graph illustrating fundamental and harmonic components of an ultra-high frequency among frequencies of RF power in a transmission line.

FIG. 3 is a graph illustrating fundamental and harmonic components of a VHF among frequencies of RF power in a transmission line, in which the horizontal axis represents the frequency of the VHF and the vertical axis represents the intensity of the VHF.

Referring to FIGS. 1 and 3, generally, when RF power is applied to the plasma chamber 500, harmonic components of frequencies of the RF power are blocked through the first plasma control circuit 320, so only the fundamental wave may be transferred to the plasma chamber 500 through the transmission line 400. However, some harmonics may not be completely blocked by the first plasma control circuit 320 and may be transferred to the plasma chamber 500, or, as described above, harmonics of the VHF may occur due to non-linear characteristics of RF power of the VHF and plasma. These harmonics may act as a cause of non-uniform distribution of plasma in the plasma chamber 500.

The graph of FIG. 3 shows that harmonics of the VHF are actually detected in the transmission line 400, for example, the transmission line 400 implemented as an RF rod. Here, peak portions may correspond to a fundamental wave, a second harmonic wave, a third harmonic wave, and the like of the VHF, respectively. For reference, the fundamental wave may correspond to the first harmonic wave.

Figure 4:
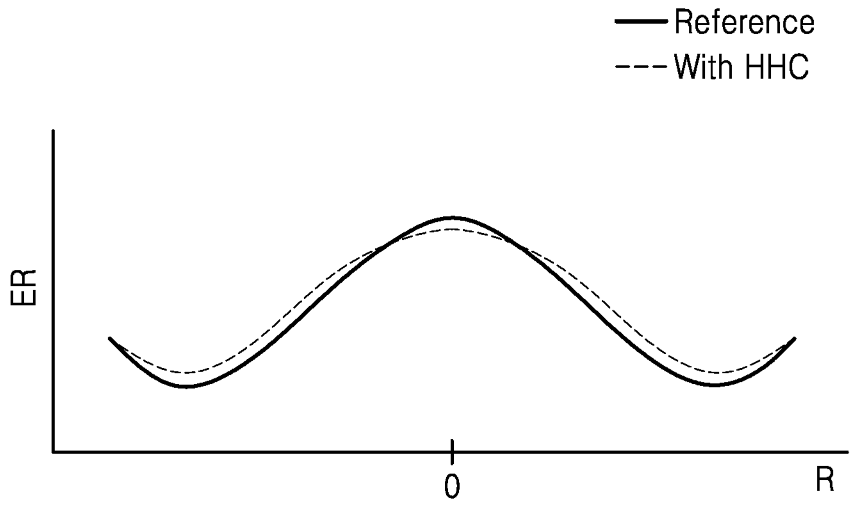
FIG. 4 is a graph illustrating a change in an etch rate of a central portion of a plasma chamber in the plasma processing system of FIG. 1.

FIG. 4 is a graph illustrating changes in an etch rate of the central portion in the plasma chamber in the plasma processing system of FIG. 1, where, similar to FIG. 2, the horizontal axis represents the radius R of the wafer 2000, and the vertical axis represents the etch rate ER. For convenience of description, descriptions are given with reference to FIG. 1 together.

Referring to FIG. 4, in the graph, the solid line is an etch rate without auxiliary RF power, which is substantially the same as the graph of FIG. 2, and the dashed line represents an etch rate of the wafer 2000 based on auxiliary RF power generation by an HHC. As described above, as can be seen from the graph, the etch rate of the central portion of the wafer 2000 may be reduced and the etch rate of the edge portion of the wafer 2000 may be increased by generating the auxiliary RF power. Accordingly, the plasma processing system 1000 of the present embodiment may effectively alleviate or eliminate the center hotspot phenomenon by generating auxiliary RF power through the second plasma control circuit 340. In addition, the plasma processing system 1000 according to the present embodiment may control etch rates according to positions of the wafer 2000 to be more uniform.

Figure 5:
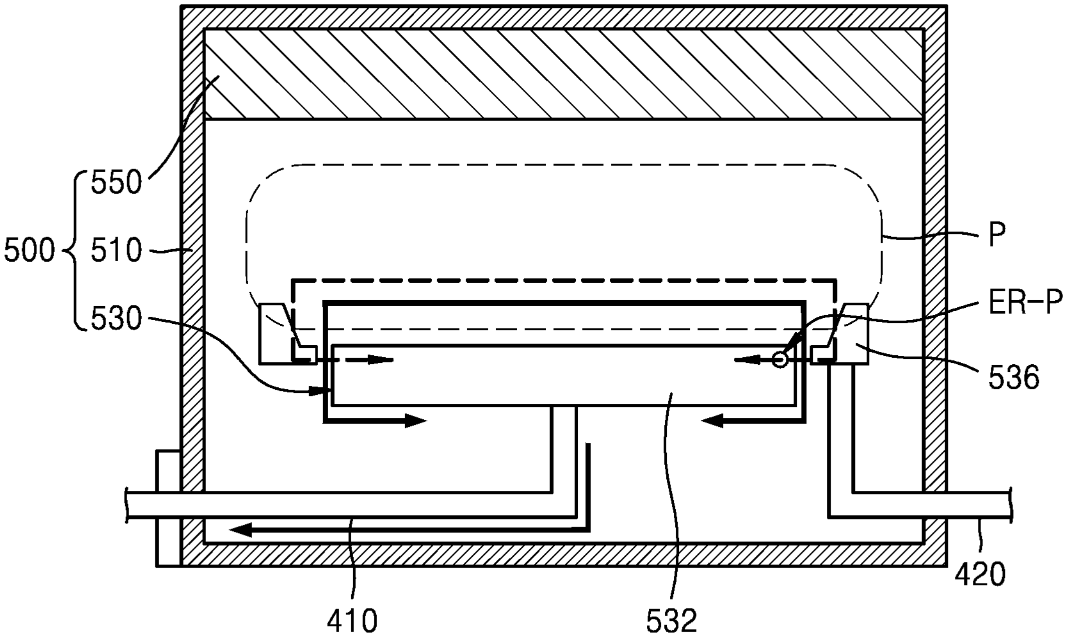
FIG. 5 is a conceptual diagram illustrating a propagation direction of harmonic components of ultra-high frequencies in the plasma processing system of FIG. 1.

FIG. 5 is a conceptual diagram illustrating a propagation direction of harmonic components of a VHF in the plasma processing system of FIG. 1. For convenience of understanding, FIG. 5 schematically shows only the electrode portion 532 and the edge ring 536 of the electrostatic chuck 530, and a portion from the chamber body 510 to the electrode portion 532 in which an electrode is substantially disposed in the electrostatic chuck 530 is considered as the first transmission line 410 to be illustrated.

Referring to FIG. 5, generally, harmonic components generated by the non-linear characteristics of RF power supplied to the plasma chamber 500 and plasma in the plasma chamber 500 may be transferred from the inside of the plasma chamber 500 to the outside through the first transmission line 410, as indicated by the straight arrows, However, due to the presence of the edge ring 536 and the conductive ring 538 in an edge region ER-P, harmonic components may be reflected by the edge ring 536 and the conductive ring 538 in the edge region ER-P to form a path, such as the dashed line arrow. The reflected harmonic components may not be transferred to the outside of the plasma chamber 500 through the first transmission line 410 and may be maintained inside the plasma chamber 500 in the form of, for example, a sinusoidal wave. Therefore, there may be limitations in controlling the harmonic components maintained inside the plasma chamber 500 by such reflection through the first plasma control circuit 320.

Figure 6:
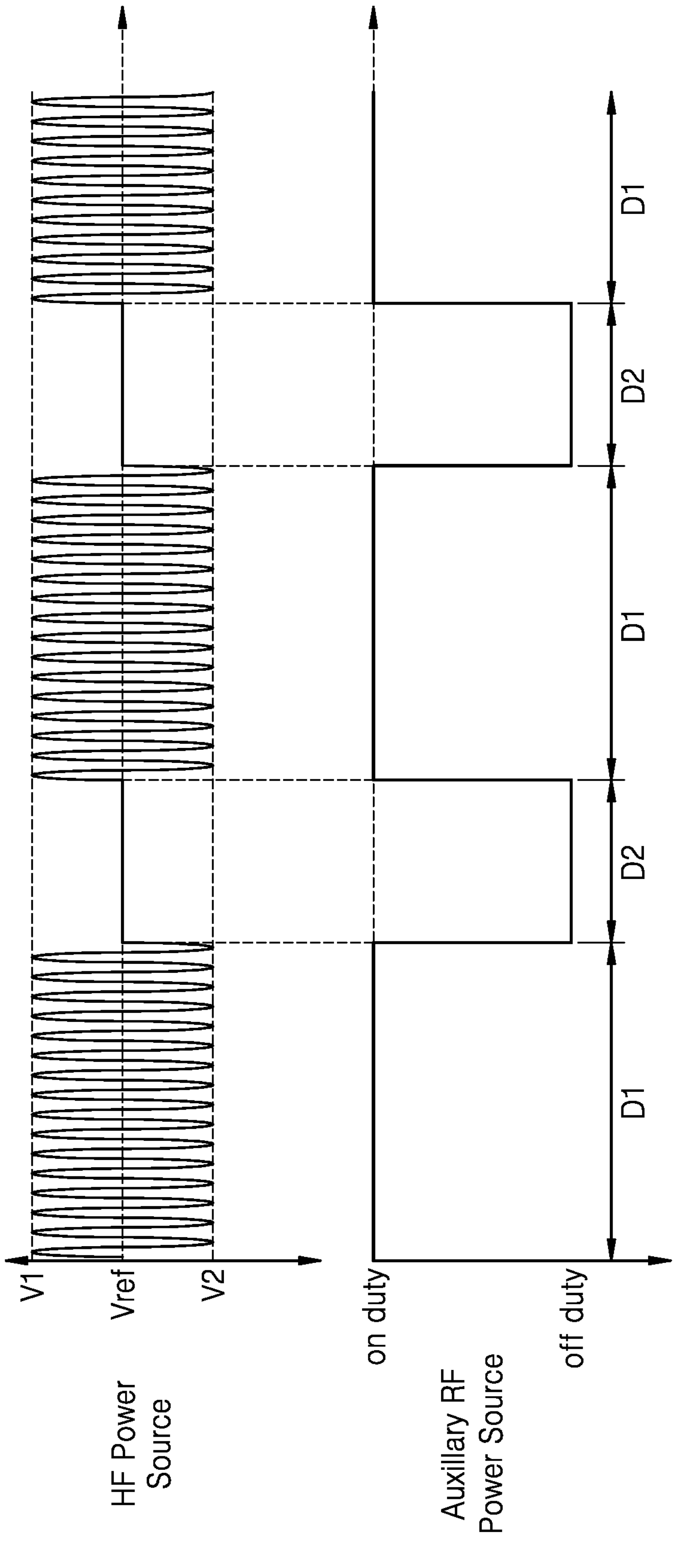
FIG. 6 is a schematic graph illustrating an operation of a plasma processing system according to an embodiment.

FIG. 6 is a schematic graph illustrating an operation of the plasma processing system 1000 according to an embodiment. In detail, FIG. 6 is a graph schematically illustrating high-frequency signals generated by a high frequency (HF) power source of the RF power source 100 of FIG. 1 and the operation of the auxiliary RF power source 380.

Referring to FIGS. 1 and 6, two graphs show changes over time of the operation of the high-frequency signal of the high frequency source and the auxiliary RF power source 380 in order from the top. In each graph, the vertical axis represents a voltage value, the horizontal axis represents time, and the graphs are aligned with each other so that the same position on the horizontal axis represents the same time.

According to embodiments, the frequency of a high-frequency signal may be from about 40 MHz to about 200 MHz or less, but is not limited thereto.

During a first period D1, the high-frequency power may be turned on. The second plasma control circuit 340 may sense turn-on of the high-frequency power to turn on the auxiliary RF power source 380. Accordingly, the sensor 360 may sense harmonics inside the plasma chamber 500 during the first period D1. For example, the sensor 360 may sense harmonics adjacent to or in the edge region of the plasma chamber 500 during the first period D1.

When the sensor 360 senses harmonics, the second plasma control circuit 340 may control the auxiliary RF power source 380 to generate auxiliary RF power to cancel out the detected harmonics. The generated auxiliary RF power may be applied in or adjacent to an edge region of the plasma chamber 500. For example, the generated auxiliary RF power may be applied to the edge ring 536 of the plasma chamber 500.

During a second period D2, the high-frequency power may be turned off. The second plasma control circuit 340 may detect turning off of the high-frequency power, and may turn off the auxiliary RF power source 380. Accordingly, during the second period D2, power applied to the auxiliary RF power source 380 may be reduced.

Figure 7:
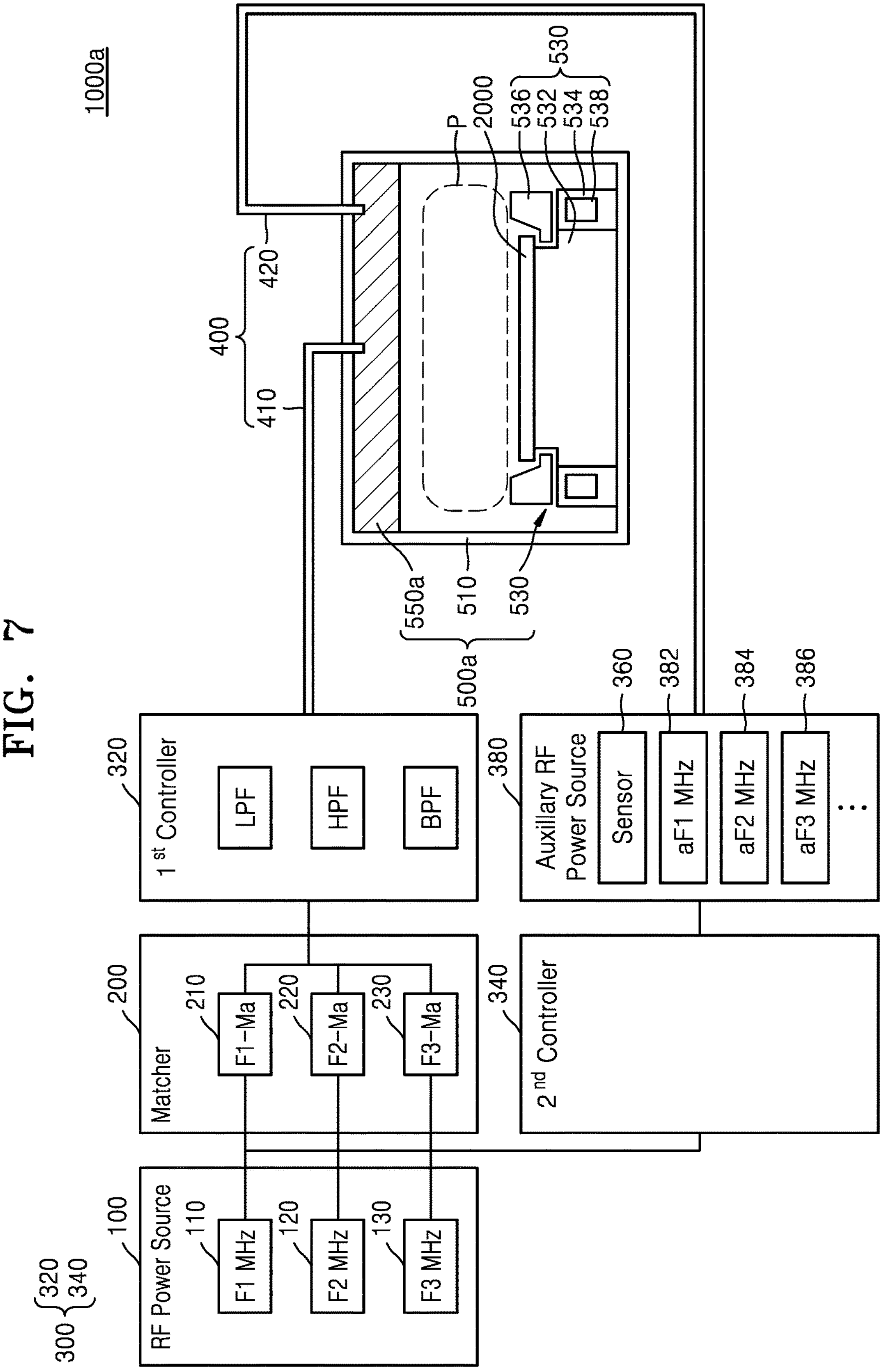
FIG. 7 is a configuration diagram of a plasma processing system according to an embodiment.

FIG. 7 is a configuration diagram of a plasma processing system 1000*a* according to an embodiment.

Referring to FIG. 7, the plasma processing system 1000*a* may be different from the plasma processing system 1000 in that RF power and auxiliary RF power are applied to a plasma chamber 500*a* through a shower head 550*a*.

In detail, in the plasma processing system 1000*a* of the present embodiment, the shower head 550*a* of the plasma chamber 500*a* may include or may form a top electrode, and the plasma control circuit 300 may be connected to the shower head 550*a* through the transmission line 400*a*. Accordingly, RF power from the RF power source 100 may be applied to the plasma chamber 500*a* through the matcher 200, the first plasma control circuit 320, the first transmission line 410*a*, and the shower head 550*a*. Also, auxiliary RF power from the auxiliary RF power source 380 may be applied to the plasma chamber 500*a* through the second transmission line 420*a* and the shower head 550*a*. In this case, the electrostatic chuck 530 including a bottom electrode may be connected to ground. Therefore, each of the RF power and the auxiliary RF power may be applied to the shower head 550*a*.

According to some other embodiments, the plasma processing system 1000*a* may have a structure in which RF power and auxiliary RF power may be applied to both the electrostatic chuck 530 and the shower head 550*a*. In the case of such a structure, the RF power source 100, the matcher 200, the plasma control circuit 300, and the auxiliary RF power source 380 may be connected to each of the electrostatic chuck 530 and the shower head 550*a*. In addition, when a plasma process is performed through the plasma processing system 1000*a* having such a structure, RF power may be applied through either the electrostatic chuck 530 or the shower head 550*a*. Also, according to embodiments, RF power may be applied alternately to the electrostatic chuck 530 and the shower head 550*a*.

In another embodiment, although not shown in FIG. 7, the plasma processing system 1000*a* may further include an auxiliary top electrode surrounding the top electrode. In this case, RF power moving along the first transmission line 410*a* may be applied to the top electrode, and auxiliary RF power may be applied to the auxiliary top electrode.

Figure 8:
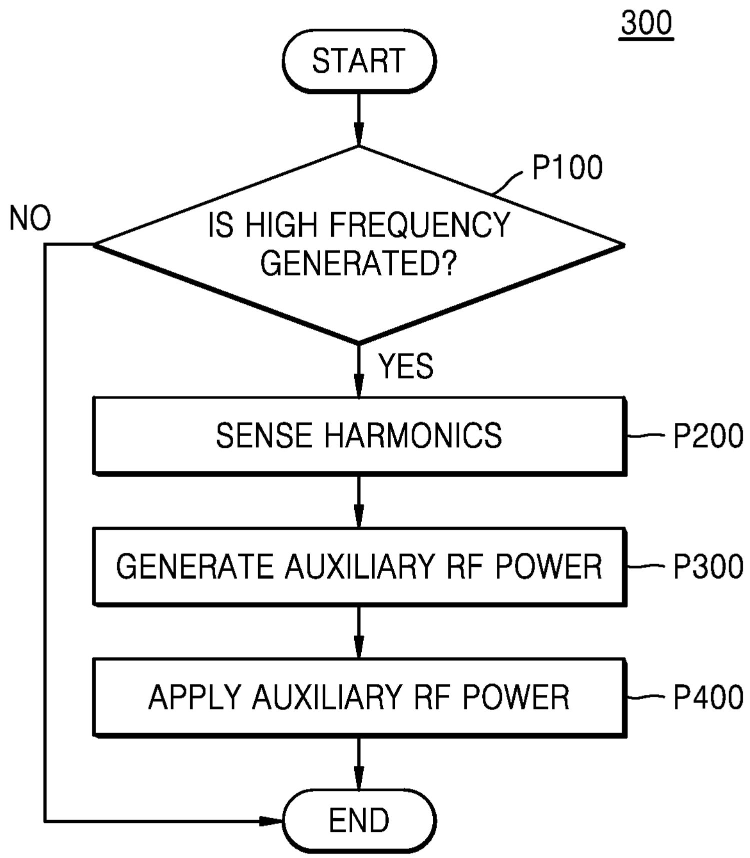
FIG. 8 is a flowchart of a substrate treating method using a plasma processing system according to an embodiment.

FIG. 8 is a flowchart of a substrate treating method 300 using a plasma processing system according to an embodiment.

Referring to FIGS. 1 and 8, the second plasma control circuit 340 may determine whether a high frequency is generated by the RF power source 100 (P100). When a high frequency is generated by the RF power source 100, the second plasma control circuit 340 may control the sensor 360 and/or the auxiliary RF power source 380 to be in an ON duty state. When a high frequency is not generated by the RF power source 100, the substrate treating method may be terminated.

Thereafter, the sensor 360 may detect harmonics (P200). The sensor 360 may detect harmonics inside the plasma chamber 500. For example, the sensor 360 may detect harmonics adjacent to or in the edge region of the plasma chamber 500. For example, the sensor 360 may detect harmonics near the edge ring 536.

Thereafter, when the sensor 360 senses harmonics, the second plasma control circuit 340 may control the auxiliary RF power source 380 to generate auxiliary RF power considering a magnitude, frequency, and phase of the sensed harmonics (P300). The auxiliary RF power source 380 may generate auxiliary RF power which is equal in magnitude and frequency and opposite in phase to the sensed harmonics.

Thereafter, the auxiliary RF power generated by the auxiliary RF power source 380 may be applied to the inside of the plasma chamber 500 through the second transmission line 420 (P400). For example, the auxiliary RF power generated by the auxiliary RF power source 380 may be applied to the edge ring 536 through the second transmission line 420, at the same time as the application of the RF power by the RF power source 100.

Figure 9:
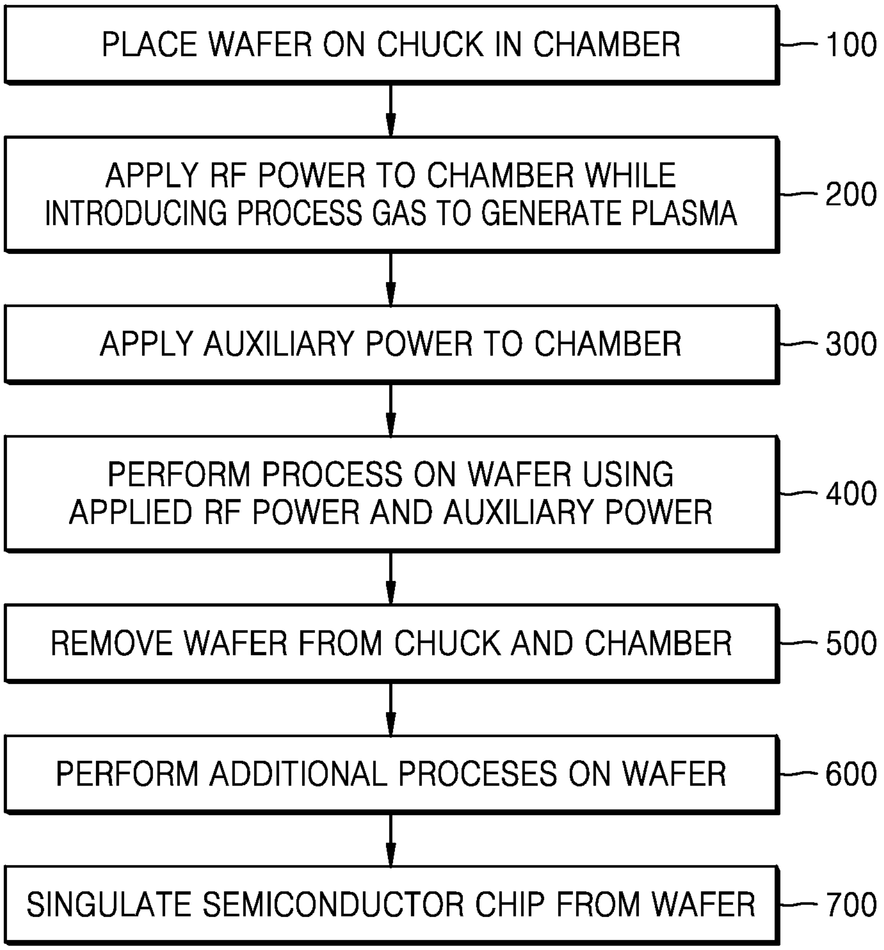
FIG. 9 is a flow chart of a method of manufacturing a semiconductor device using a plasma processing system, according to some embodiments.

FIG. 9 is a flow chart of a method of manufacturing a semiconductor device using a plasma processing system such as plasma processing system 1000 or 1000*a* described above. Referring to FIGS. 1, 8, and 9, in step 100, a wafer 2000 is placed on a chuck 530 in a plasma chamber 500. The wafer 2000, may include patterns formed thereon, such as semiconductor patterns, metal patterns, or insulating patterns, and/or a photoresist pattern. In step 200, an RF power is applied to the chamber 500 while introducing a process gas to the chamber to generate a plasma. In step 300, the method of FIG. 8 is performed to apply an auxiliary RF power along with the RF power to the chamber. Subsequently, the RF power may be turned off, and the method of FIG. 8 may be repeated, as discussed above, so that both a main RF power and an auxiliary RF power are is intermittently applied and turned off together during a plasma process. During steps 200 and 300, a process 400 may be performed on the wafer using the applied main RF power and auxiliary RF power. For example, an etching, cleaning, or deposition process may be performed on the wafer. In step 500, after completing the plasma process, the wafer is removed from the chuck 530 and the chamber 500. In step 600, additional processes may be performed on the substrate, for example in other chambers, such as further etching, deposition, patterning, cleaning, etc., to eventually form a integrated circuit on the wafer. The integrated circuit may be one of a plurality of integrated circuits formed in an array pattern on the wafer, to form a plurality of semiconductor chips (e.g., memory chips or logic chips). Then in step 700, the plurality of semiconductor chips may be separated from each other, for example using sawing, laser cutting or another singulation process, to form individual semiconductor devices.

While the inventive concept has been particularly shown and described with reference to embodiments thereof, it will be understood that various changes in form and details may be made therein without departing from the spirit and scope of the following claims.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

What is claimed is:

1. A plasma control apparatus comprising:

a first transmission line and a second transmission line, each connected to transfer radio frequency (RF) power to a plasma chamber through at least two frequencies, wherein RF power transferred by the first transmission line is main RF power and RF power transferred by the second transmission line is auxiliary RF power;

a matching circuit connected to the first transmission line and configured to adjust impedance to increase power transmission of the main RF power;

a first plasma control circuit connected to the first transmission line and configured to selectively and independently control harmonics of one or more of the at least two frequencies of the main RF power;

a sensor configured to sense harmonics of the main RF power in the plasma chamber;

an auxiliary RF power source connected to the second transmission line and configured to generate auxiliary RF power; and a second plasma control circuit connected to the second transmission line and configured to control the auxiliary RF power source to generate auxiliary RF power to cancel out the harmonics sensed by the sensor, wherein, in a plan view, the first transmission line transfers the main RF power to a central region of the plasma chamber, and the second transmission line transfers the auxiliary RF power to an edge region outside of the central region of the plasma chamber.

2. The plasma control apparatus of claim 1, wherein the sensor is configured to sense the harmonics at the edge region of the plasma chamber.

3. The plasma control apparatus of claim 1, wherein:

the plasma chamber further includes an electrostatic chuck configured to support a wafer, the electrostatic chuck comprises:

an electrode portion disposed in a central portion of a lower portion of the plasma chamber; and an edge ring surrounding the electrode portion and having a ring shape, and the first transmission line is connected to supply the main RF power to the electrode portion, and the second transmission line is connected to supply the auxiliary RF power to the edge ring.

4. The plasma control apparatus of claim 3, wherein the sensor is configured to sense plasma on the edge ring.

5. The plasma control apparatus of claim 1, wherein:

the plasma chamber includes a top electrode and a bottom electrode, and the first transmission line and the second transmission line respectively supply the main RF power and the auxiliary RF power to the top electrode.

6. The plasma control apparatus of claim 1, wherein the frequencies of the auxiliary RF power are each an integer multiple of one of the frequencies of the main RF power.

7. The plasma control apparatus of claim 1, wherein the first plasma control circuit includes at least one of a low pass filter (LPF), a band pass filter (BPF), and a high pass filter (HPF).

8. A plasma control apparatus comprising:

a plasma chamber including an electrode portion and an edge ring surrounding the electrode portion and having a ring shape;

a first transmission line and a second transmission line, each transferring radio frequency (RF) power to the plasma chamber through at least two frequencies, wherein RF power transferred by the first transmission line is main RF power, and RF power transferred by the second transmission line is auxiliary RF power;

a matching circuit connected to the first transmission line and configured to adjust impedance to increase power transmission of the main RF power;

a first plasma control circuit connected to the first transmission line and configured to selectively and independently control one or more harmonics of the at least two frequencies of the main RF power;

a sensor configured to sense the harmonics of the main RF power in the plasma chamber;

an auxiliary RF power source connected to the second transmission line and configured to generate auxiliary RF power; and a second plasma control circuit connected to the second transmission line and configured to control the auxiliary RF power source to generate auxiliary RF power to cancel out the harmonics sensed by the sensor, wherein, in a plan view, the first transmission line is connected to transfer the main RF power to a center region of the plasma chamber, and the second transmission line is adjacent to an edge of the plasma chamber to transfer the auxiliary RF power to an edge region of the plasma chamber.

9. The plasma control apparatus of claim 8, wherein:

the first transmission line is connected to supply the main RF power to the electrode portion, the second transmission line is connected to supply the auxiliary RF power to the edge ring, and the sensor is configured to sense the harmonics in a region of the plasma chamber adjacent to the edge ring.

10. The plasma control apparatus of claim 8, wherein the second plasma control circuit is configured to repeatedly turn on and off the sensor and the auxiliary RF power source.

11. The plasma control apparatus of claim 8, wherein the second plasma control circuit is configured to turn on the sensor or the auxiliary RF power source when a high-frequency signal, among the main RF power, is applied.

12. The plasma control apparatus of claim 11, wherein the high-frequency signal, among the main RF power, has a frequency of about 40 MHz to about 200 MHz.

13. The plasma control apparatus of claim 8, wherein the second plasma control circuit is configured to control the auxiliary RF power source to generate the auxiliary RF power which is equal in magnitude and frequency and opposite in phase to the harmonics sensed by the sensor.

14. The plasma control apparatus of claim 8, wherein the second plasma control circuit is configured to turn off the sensor or the auxiliary RF power source when a high-frequency signal, among the main RF power, is not applied.

15. The plasma control apparatus of claim 8, wherein the auxiliary RF power source includes a plurality of auxiliary sources having different frequencies, and a frequency of at least one of the plurality of auxiliary sources is an integer multiple of one of the frequencies of the main RF power.

* * * * *